United States Patent
Goldhaber et al.

(10) Patent No.: US 7,671,593 B2
(45) Date of Patent: Mar. 2, 2010

(54) RF BODY COIL WITH ACOUSTIC ISOLATION OF CONDUCTORS

(75) Inventors: David M. Goldhaber, Shorewood, WI (US); Darren Lee Hallman, Scotia, NY (US); Anton Max Linz, Mukwonago, WI (US)

(73) Assignee: General Electric Company, Schenectady, NY (US)

( * ) Notice: Subject to any disclaimer, the term of this patent is extended or adjusted under 35 U.S.C. 154(b) by 144 days.

(21) Appl. No.: 11/424,293

(22) Filed: Jun. 15, 2006

(65) Prior Publication Data

US 2007/0290686 A1   Dec. 20, 2007

(51) Int. Cl.
*G01V 3/00* (2006.01)
(52) U.S. Cl. .................. 324/318; 324/309; 324/307
(58) Field of Classification Search ......... 324/300–322; 181/30, 290, 285, 202; 600/407–435
See application file for complete search history.

(56) References Cited

U.S. PATENT DOCUMENTS

| 4,651,099 | A  | * | 3/1987  | Vinegar et al. ............ 324/320 |
| RE33,505  | E  | * | 12/1990 | Vinegar et al. ............ 324/320 |
| 5,427,102 | A  | * | 6/1995  | Shimode et al. ........... 600/410 |
| 6,011,393 | A  | * | 1/2000  | Kaufman et al. ........... 324/318 |
| 6,252,404 | B1 | * | 6/2001  | Purgill et al. ............. 324/318 |
| 6,414,489 | B1 |   | 7/2002  | Dean et al. |
| 6,437,568 | B1 | * | 8/2002  | Edelstein et al. ........... 324/318 |
| 6,564,900 | B1 | * | 5/2003  | Dean et al. ................ 181/202 |
| 6,626,264 | B1 | * | 9/2003  | Christen .................. 181/290 |
| 6,810,990 | B2 | * | 11/2004 | Dean et al. ................ 181/202 |
| 7,053,744 | B2 | * | 5/2006  | Arz et al. .................. 324/318 |
| 7,068,033 | B2 | * | 6/2006  | Sellers et al. .............. 324/318 |
| 7,246,681 | B2 | * | 7/2007  | Christen .................. 181/285 |
| 2003/0080742 | A1 | * | 5/2003  | Stofiel .................... 324/322 |
| 2003/0088172 | A1 | * | 5/2003  | Kuth ..................... 600/407 |
| 2003/0196852 | A1 | * | 10/2003 | Dean et al. ................ 181/202 |
| 2004/0026162 | A1 | * | 2/2004  | Christen .................. 181/30 |
| 2005/0040825 | A1 | * | 2/2005  | Sellers et al. .............. 324/318 |
| 2005/0258923 | A1 | * | 11/2005 | Arz et al. .................. 335/216 |
| 2007/0290686 | A1 | * | 12/2007 | Goldhaber et al. .......... 324/318 |

* cited by examiner

*Primary Examiner*—Brij B. Shrivastav
*Assistant Examiner*—Tiffany A Fetzner
(74) *Attorney, Agent, or Firm*—Ziolkowski Patent Solutions Group, SC

(57) ABSTRACT

A system for isolating vibration and reducing acoustic noise in the RF coil of an MR imaging apparatus is presented. The system positions an RF conductor in its operative position proximate to an RF support form. The RF conductor is sandwiched between a vibration decoupling layer and a mass loading layer. The vibration decoupling layer is affixed to the RF support form so that the vibration decoupling layer is positioned between the RF conduit and the RF support form while the mass loading layer is located exterior of the RF conductor. By this arrangement, the acoustic energy is decoupled from the RF support form by the vibration decoupling layer while the vibration is reduced by the mass loading layer located exterior of the RF conductor.

18 Claims, 3 Drawing Sheets

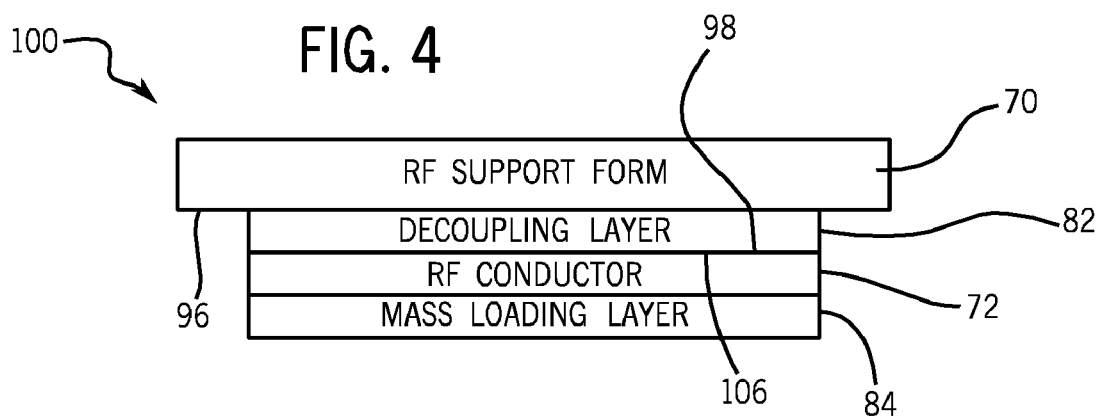

RF BODY COIL WITH ACOUSTIC ISOLATION OF CONDUCTORS

BACKGROUND OF THE INVENTION

The present invention relates generally to an RF coil used in an MR imaging system, and, more particularly, to an RF coil having enhanced acoustic deadening properties.

With MR scanners, the apparatus basically includes an RF coil that surrounds the subject and which directs the RF energy toward the subject or which receives RF energy from the subject, in carrying out the scanning process.

One of the difficulties of such MR scanners, however, is that the noise level can become uncomfortably loud, both for the patient, or subject, and for the operators. The source of such acoustic noise can be many and varied, however, the RF coil has been shown to be a major contributor.

The noise from the RF coil is due to Lorentz forces set up in the RF conductors and, while other acoustic noise sources in the MR scanner can be addressed by standard vibration isolation techniques, the acoustic noise from the RF coil is more difficult to control due to its close proximity to the patient, or subject, bore.

There have been attempts at reducing the acoustic noise from the RF coil. Such attempts have included breaking up the RF conductor, where possible, to reduce eddy currents and constrained layer damping to reduce the RF support form vibration. These attempts, however, have not been able to eliminate all of the acoustic noise from the RF coil.

It would therefore be desirable to have a RF coil having a reduced acoustic output by providing vibration isolation between the RF conductors and the RF support form as well as providing damping to reduce the vibration from the RF conductor to the RF support form.

BRIEF DESCRIPTION OF THE INVENTION

The present invention provides a system and method of providing reduced acoustic output by providing vibration isolation between an RF conductor and an RF support form of an MRI system.

In accordance with one aspect of the invention, an MR scanning apparatus includes an isolating decoupling layer that is located between an RF conductor and an RF support form, and a mass loading layer is attached to the RF conductor.

In accordance with another aspect of the invention, a method of constructing an RF coil that includes affixing a vibration decoupling layer between an RF conductor and an RF support form, and affixing a mass loading layer to the RF conductor.

In accordance with another aspect of the invention, a magnetic resonance imaging system that includes an RF transceiver system and a gradient coil assembly, wherein the RF transceiver system includes an RF conductor, an RF support form, a vibration decoupling layer attached between the RF conductor and the RF support form, and a mass loading layer attached to the RF conductor.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings:

FIG. 4 is a cross-sectional view of a RF conductor and mass loading layer affixed to an RF support form in accordance with an alternate embodiment of the present invention.

DETAILED DESCRIPTION OF THE PREFERRED EMBODIMENT

A system is shown to isolate vibration, reduce the vibration natural frequency, and reduce acoustic noise in the RF coil of an MR imaging apparatus.

Figure 1:
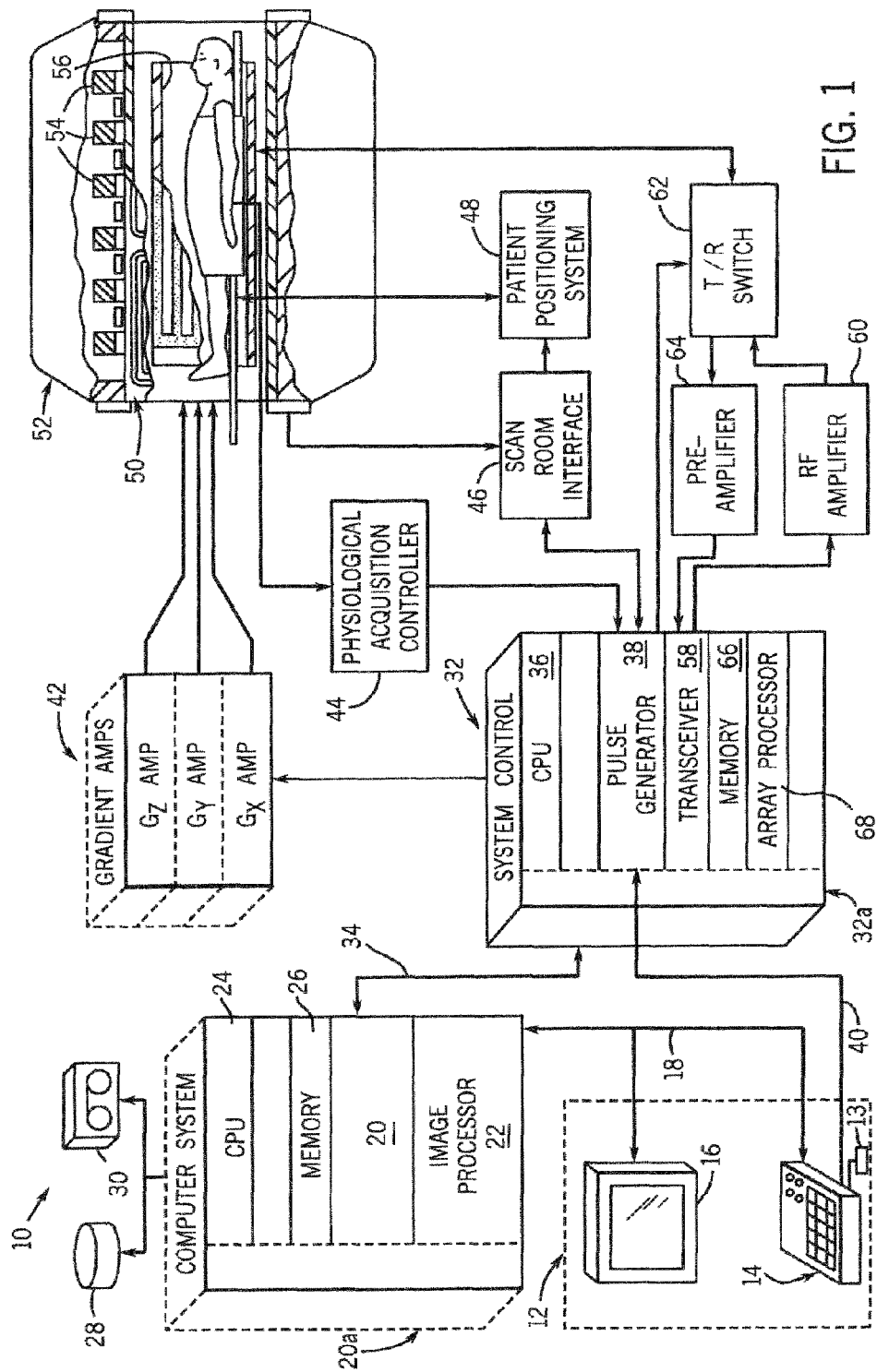
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and removable storage 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
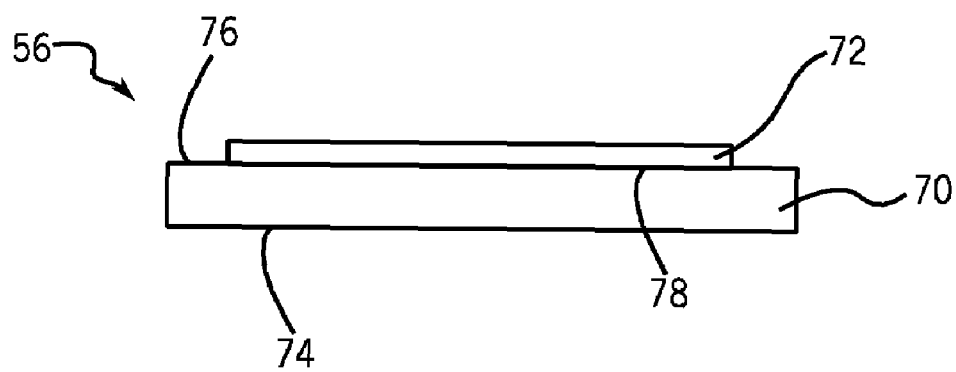
FIG. 2 is a cross-sectional view of a present RF conductor affixed directly to an RF support form.

Turning now to FIG. 2, there is shown a cross-sectional view of a conventional RF coil 56 and which comprises an RF support form 70 that is cylindrical. The RF support form 70 is normally of a fiberglass material and surrounds the patient. An RF conductor 72 is present to generate or receive the RF energy used in the scanning process. The RF support form 70 has an interior surface 74 that faces towards the patient and an exterior surface 76 that faces outwardly. As such, the interior surface 78 of the RF conductor 72 contacts the exterior surface 76 of the RF support form 70 and is adhesively bonded thereto.

As can be seen in FIG. 2, the conventional system has the RF conductor 72 directly affixed to the RF support form 70 and, therefore, vibrations can travel directly from the RF conductor 72 to the RF support form 70, such that the RF support form 70 acts as a large sounding board to transmit vibration to the surrounding environment resulting in acoustic noise.

Figure 3:
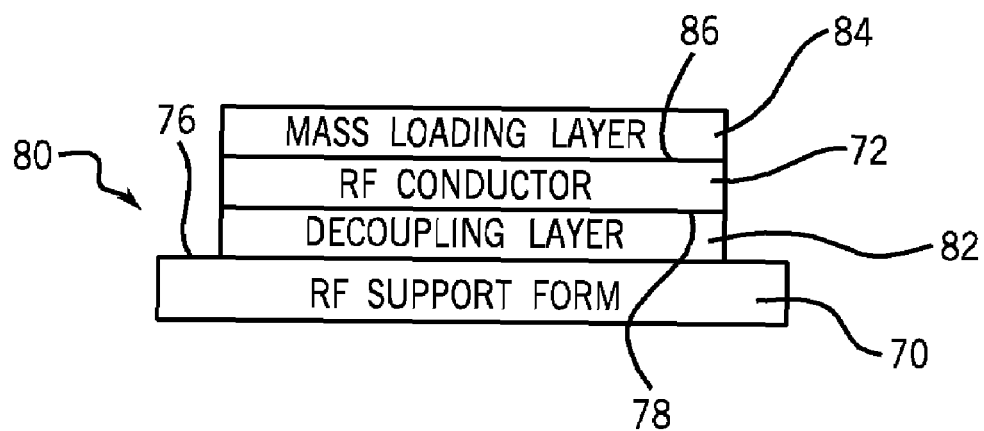
FIG. 3 is a cross-sectional view of a RF conductor and mass loading layer affixed to an RF support form in accordance with the preferred embodiment of the present invention.

Turning now to FIG. 3, there is shown, a cross-sectional view of an RF coil 80 constructed in accordance with the preferred embodiment of the present invention. The RF conductor 72 is affixed exterior, or radially outward, to the RF support form 70, as in the FIG. 2 embodiment; however, as can be seen, there is decoupling layer 82 of a vibration, or mechanical, decoupling material that is located between the RF conductor 72 and the RF support form 70. The decoupling layer 82 is in the form of a layer of a decoupling material and is a vibration isolating material, such as a foam, and which decouples and isolates the acoustic energy of the RF conductor 72 from the RF support form 70. Basically, a soft foam material can be used for the intermediate decoupling layer 82; however, other material could be used that provides the isolation of acoustic energy.

Thus, the intermediate decoupling layer 82 is affixed to the interior surface 78 of the RF conductor 72 and the exterior surface 76 of the RF support form 70. That affixation can be accomplished by a suitable adhesive.

There is also present a mass loading layer 84 that is located on the exterior surface 86 of the RF conductor 72. The mass loading layer 84 replaces the loading effect of the RF support form 70 and reduces the natural frequency of the overall RF conductor 72/decoupling layer 82 combination. As such, the mass loading layer 84 reduces the overall transferred vibration energy to the RF support form 70 and, with the mass loading layer 84, the vibration of the RF conductor 72 decreases and reduces the overall acoustic noise. The mass loading layer 84 can be a heavy material such as a vinyl material having, for example, barium salt contained therein to increase the mass of the material.

As can now be seen, the RF conductor 72 is basically fixed in an operative position proximate to the RF support form 70 and is sandwiched between the vibration decoupling layer 82 and the mass loading layer 84. The RF conductor 72 is therefore affixed to the RF support form 70 providing a combination of decoupling and mass loading that effectively reduces the vibration energy generated by the RF conductor 72 from reaching and affecting the RF support form 70, thus reducing the acoustic noise of the system.

Referring to FIG. 4, there is shown, a cross-sectional view of an RF coil 100 constructed in accordance with an alternate embodiment of the present invention. The RF conductor 72 is affixed interior, or radially inward, to the RF support form 70. However, as can be seen, there is decoupling layer 82 of a vibration, or mechanical, decoupling material that is located between the RF conductor 72 and the RF support form 70. The decoupling layer 82 is in the form of a layer of a decoupling material and is a vibration isolating material, such as a foam, and which decouples and isolates the acoustic energy of the RF conductor 72 from the RF support form 70. Basically, a soft foam material can be used for the intermediate decoupling layer 82; however, other material could be used that provides the isolation of acoustic energy.

Thus, the intermediate decoupling layer 82 is affixed to the exterior surface 98 of the RF conductor 72 and the interior surface 96 of the RF support form 70. That affixation can be accomplished by a suitable adhesive.

There is also present a mass loading layer 84 that is located on the interior surface 106 of the RF conductor 72. The mass loading layer 84 replaces the loading effect of the RF support form 70 and reduces the natural frequency of the overall RF conductor 72/decoupling layer 82 combination. As such, the mass loading layer 84 reduces the overall transferred vibration energy to the RF support form 70 and, with the mass loading layer 84, the vibration of the RF conductor 72 decreases and reduces the overall acoustic noise. The mass loading layer 84 can be a heavy material such as a vinyl material having, for example, barium salt contained therein to increase the mass of the material.

The RF conductor 72 is basically fixed in an operative position proximate to the RF support form 70 and is sandwiched between the vibration decoupling layer 82 and the mass loading layer 84. The RF conductor 72 is therefore affixed to the RF support form 70 providing a combination of decoupling and mass loading that effectively reduces the vibration energy generated by the RF conductor 72 from reaching and affecting the RF support form 70, thus reducing the acoustic noise of the system.

While the description of the preferred embodiments has been focused on a cylindrical RF coil which surrounds the subject, the invention also may have application for other type of RF coils. These include but are not limited to transmit/receive surface coils and receive only surface coils.

The present invention has been described in terms of the preferred embodiment and an alternate embodiment, and it is recognized that equivalents, alternatives, and modifications, aside from those expressly stated, are possible and within the scope of the appending claims.

What is claimed is:

1. An RF coil configured for an MR scanning apparatus comprising:
    an RF support form, the RF support form having an internal surface facing a subject and also having an external surface;
    an RF conductor located proximate to the RF support form, the RF conductor having an internal surface and an external surface;
    a vibration decoupling layer affixed intermediate to the RF conductor and the RF support form, wherein the vibration decoupling layer is affixed to the external surface of the RF support form and the internal surface of the RF conductor; and
    a mass loading layer affixed to a surface of the RF conductor, whereby the RF conductor is sandwiched between the vibration decoupling layer and the mass loading layer.

2. The RF coil of claim 1 wherein the vibration decoupling layer is comprised of a soft foam material.

3. The RF coil of claim 1 wherein the mass loading layer comprises a heavy material affixed along the exterior surface of the RF conductor, in order to increase a mass of the mass loading layer and wherein the mass loading layer is configured to reduce a natural frequency of the RF conductor and the vibration decoupling layer.

4. The RF coil of claim 1 wherein an adhesive is used to affix the mass loading layer to the surface of the RF conductor.

5. The RF coil of claim 1 wherein the mass loading layer is comprised of a vinyl material filled with a barium salt.

6. The RF coil of claim 1 wherein the mass loading layer is affixed along the interior surface of the RF conductor.

7. A method of constructing an RF coil comprising the steps of:
    providing an RF support form of a generally cylindrical shape having an interior surface facing a patient bore and an exterior surface;
    affixing a vibration decoupling layer to the RF support form;
    affixing an RF conductor to the vibration decoupling layer, the RF conductor having an interior surface affixed to the vibration decoupling layer and an exterior surface opposite thereof; and
    affixing a mass loading layer to the exterior surface of the RF conductor whereby the RF conductor is positioned between the vibration decoupling layer and the mass loading layer.

8. The method of claim 7 wherein the vibration decoupling layer comprises a soft foam material.

9. The method of claim 7 wherein the mass loading layer is located external to the RF coil and the RF coil is located external to the RF support form.

10. The method of claim 7 wherein the mass loading layer is located internal to the RF coil and the RF coil is located internal to the RF support form.

11. The method of claim 7 wherein the affixing steps are performed using an adhesive.

12. The method of claim 7 wherein the mass loading layer comprises a vinyl material filled with a barium salt.

13. A magnetic resonance imaging (MRI) system comprising:
    an RF transceiver system to acquire MR images; and
    a gradient coil assembly positioned about a bore of a magnet to impress a polarizing magnetic field, wherein the gradient coil assembly includes a polarizing magnet and RF coil, wherein the RF coil includes:
    an RF conductor;
    a contiguous cylindrical RF support form located proximate the RF conductor and configured to surround a patient within the MRI system;
    a vibration decoupling layer affixed to a first surface of the RF conductor and a surface of the RF support form; and
    a mass loading layer affixed to a second surface of the RF conductor whereby the RF conductor is located between the vibration decoupling layer and the mass loading layer.

14. The MRI system of claim 13 wherein the RF conductor is positioned external to the RF support form.

15. The MRI system of claim 13 wherein the RF conductor is positioned internal to the RF support form.

16. The MRI system of claim 13 wherein an adhesive is used to affix the vibration decoupling layer to a first surface of the RF conductor and a surface of the RF support form and to affix the mass loading layer to the second surface of the RF conductor.

17. The MR/system of claim 13 wherein the mass loading layer comprises a vinyl material filled with a barium salt.

18. The MR/system of claim 13 wherein the vibration decoupling layer comprises a soft foam material.

* * * * *